United States Patent [19]

Henderson et al.

[11] Patent Number: 4,920,344
[45] Date of Patent: Apr. 24, 1990

[54] DIGITALLY COMPENSATED MULTIPLYING DIGITAL TO ANALOG CONVERTER

[75] Inventors: David L. Henderson; Carl M. Stanchak, both of Colorado Springs, Colo.

[73] Assignee: NCR Corporation, Dayton, Ohio

[21] Appl. No.: 205,046

[22] Filed: Jun. 2, 1988

Related U.S. Application Data

[60] Continuation of Ser. No. 3,153, Jan. 14, 1987, abandoned, Division of Ser. No. 710,658, Mar. 11, 1985, Pat. No. 4,779,029.

[51] Int. Cl.$^5$ ............................................. H03M 1/76
[52] U.S. Cl. .................................... 341/118; 341/153; 341/154; 341/144
[58] Field of Search ................ 341/118, 144, 153, 154

[56] References Cited

U.S. PATENT DOCUMENTS

| | | | |
|---|---|---|---|
| 3,400,257 | 9/1968 | Smith | 341/144 |
| 3,857,021 | 12/1974 | Wilenski et al. | 341/154 |
| 4,168,528 | 9/1979 | Comer | 341/144 |
| 4,349,811 | 9/1982 | Brokaw | 341/154 |
| 4,363,024 | 12/1982 | Brokaw | 341/154 |
| 4,580,131 | 4/1986 | Seiler | 341/154 |
| 4,631,522 | 12/1986 | Cabot | 341/154 |
| 4,721,943 | 1/1988 | Stallkamp | 315/367 |
| 4,774,495 | 9/1988 | Rafter et al. | 341/144 |

Primary Examiner—William M. Shoop, Jr.
Assistant Examiner—Gary J. Romano
Attorney, Agent, or Firm—Wilbert Hawk, Jr.; Casimer K. Salys

[57] ABSTRACT

A multiplying digital to analog converter using ladder networks and binary weighted load compensation to allow integration and video frequency operation. In one form, the circuit is configured from field effect transistors which incorporate by virtue of their structural and operational characteristics both the switching and resistive functions of R-2R ladder networks. The circuit is used to convert digital format words representing intensity and color (red, green and blue) into analog red, green and blue display drive signals. According to that configuration, the output of the digital to analog intensity word converter serves as the reference for the three digital to analog color word converters. Loading effects attributable to differences in the bit content of the color words are offset by a binary weighted switched load which is responsive to a digital compensation word. The switched load is also connected to the output of the intensity word converter. This circuit configuration provides an implementation by which the color (hue and saturation) in analog form can be held constant while the intensity of the color is selectively varied.

9 Claims, 7 Drawing Sheets

FIG. 2

OVERLAY CONTROL REGISTER

LOGIC

| CONTROL DATA | | EFFECT |
|---|---|---|
| Bit 4 | — | '0' Use flood color during display and allow processor access to overlay/flood colors and intensities during blanking. |
| | | '1' Disable flood color and allow processor access to normal colors and intensities during blank time. |
| Bit 3 | — | '0' Use pixel bit 7 for normal intensity. |
| | | '1' Use overlay 7 whenever pixel bit 7 is set. |
| Bit 2 | — | '0' Use pixel bit 6 for normal intensity. |
| | | '1' Use overlay 6 whenever pixel bit 6 is set and overlay 7 is not selected. |
| Bit 1 | — | '0' Use pixel bit 5 for normal intensity. |
| | | '1' Use overlay 5 whenever pixel bit 5 is set and overlays 6 and 7 are not selected. |
| Bit 0 | — | '0' Use pixel bit 4 for normal intensity. |
| | | '1' Use overlay 4 whenever pixel bit 4 is set and overlays 5 and 6 and 7 are not selected. |

Note that the definition of the overlay planes are designated as 4 through 7, corresponding to the 4 intensity bits.

DIGITALLY COMPENSATED MULTIPLYING DIGITAL TO ANALOG CONVERTER

This is a continuation of co-pending application Ser. No. 7/003,153 filed on Jan. 14, 1987 now abandoned which is a division of 710,658 filed on 3/11/85 now U.S. Pat. No. 4,779,029.

BRIEF SUMMARY

The present invention relates to an electronic circuit for converting multiple sets of digital information to analog equivalents while proportionately adjusting each converted signal by a common multiplication factor. As implemented, multiplication is performed by cascading digital to analog (D/A) converters so that the output of the multiplication factor D/A stage generates the reference signal for the succeeding multiplicand stages. High frequency performance with relatively accurate digital to analog conversion, in the presence of dynamically varying load impedances associated with different digital words, is attained by providing a supplemental digital to analog converter, which converter serves to adjust the effective load impedance of the succeeding stages with changes in the bit content of the digital signals being converted in such stages. Thereby, the multiplication circuitry is not affected by the incremental changes in the composition of the binary input words.

In one form of its practice, the invention serves as a color balanced fade control. According to that use, the color is composed of individual binary words corresponding to the red, green and blue constituents of the composite hue and saturation, are adjusted equally by a single intensity data word and then converted to their analog equivalents, all at video frequency. As implemented, the three digital color words, corresponding to red, green and blue, as well as the corresponding digital intensity word, are stored in segments of a random access memory (RAM) and supplemented with a compensation word, stored in another segment of RAM. Corresponding intensity, red, green, blue and compensation words are simultaneously addressed for transmission in digital form to the compensated multiplying D/A converter. The converter itself is composed of substantially duplicated circuitry of the R-2R ladder form, one ladder for each individual digital intensity and color word, interconnected such that the output of the intensity ladder provides the reference voltage for the red, green and blue color ladders. As embodied, the compensation words are coupled to a binary weighted compensation circuit. The compensation circuit is also coupled to the output of the intensity ladder, but is operated so as to offset the effective load impedance variations appearing at the output of the intensity ladder with changes in the bit content of the color words conveyed to the red, green and blue color ladders.

Preferably, the intensity ladder, color ladders and compensation circuit are configured to integrate the switching and resistor functions of an R-2R ladder or binary weighted resistive load circuit into the individualized parameters of the field effect transistors which form the implementing circuitry. In this way discrete devices are avoided while the bandwidth of the multiplying D/A converter is increased.

According to one embodiment, a microprocessor type controller is operated in response to compensation software to generate the compensation word corresponding to each set of red, green and blue color words at the time the three color words are formed, as an alternative to having a potentially large compensation word look-up table.

DESCRIPTION OF THE DRAWINGS

FIG. 2 is a tabulation of the logic used to generate color overlay controls in conjunction with the block diagram set forth in FIG. 1.

DETAILED DESCRIPTION

Among the integrated circuit color graphics controllers presently available on the market, there appears a distinct lack of an integrated circuit controller which provides a chip-area efficient implementation for converting digital color (hue and saturation) and intensity data into analog signals suitable to control the red, green and blue guns of a video display while providing the ability to fade the colors, change the selectable group of colors, and provide overlay and flood colors, where all the color sets are alterable at frequencies compatible with the blanking cycle of the color video displays. The present invention, in its various forms, satisfies these objectives by providing a dynamically variable set of pixel colors in digital format and grouped by intensity, red color, green color and blue color, which colors are intensity adjusted and converted into analog signals with a cascaded, multiple stage R-2R type D/A converter employing switches and resistive elements integrated into field effect transistors. To attain video frequency operation of the function by which color data is multiplied equally by common intensity data in the context of R-2R ladders, compensation data is generated for each color and concurrently converted to analog form in such a way as to offset ladder impedance changes with color data content in the context of cascaded R-2R ladders. In this way, color balance can be maintained during intensity fading.

Figure 1:
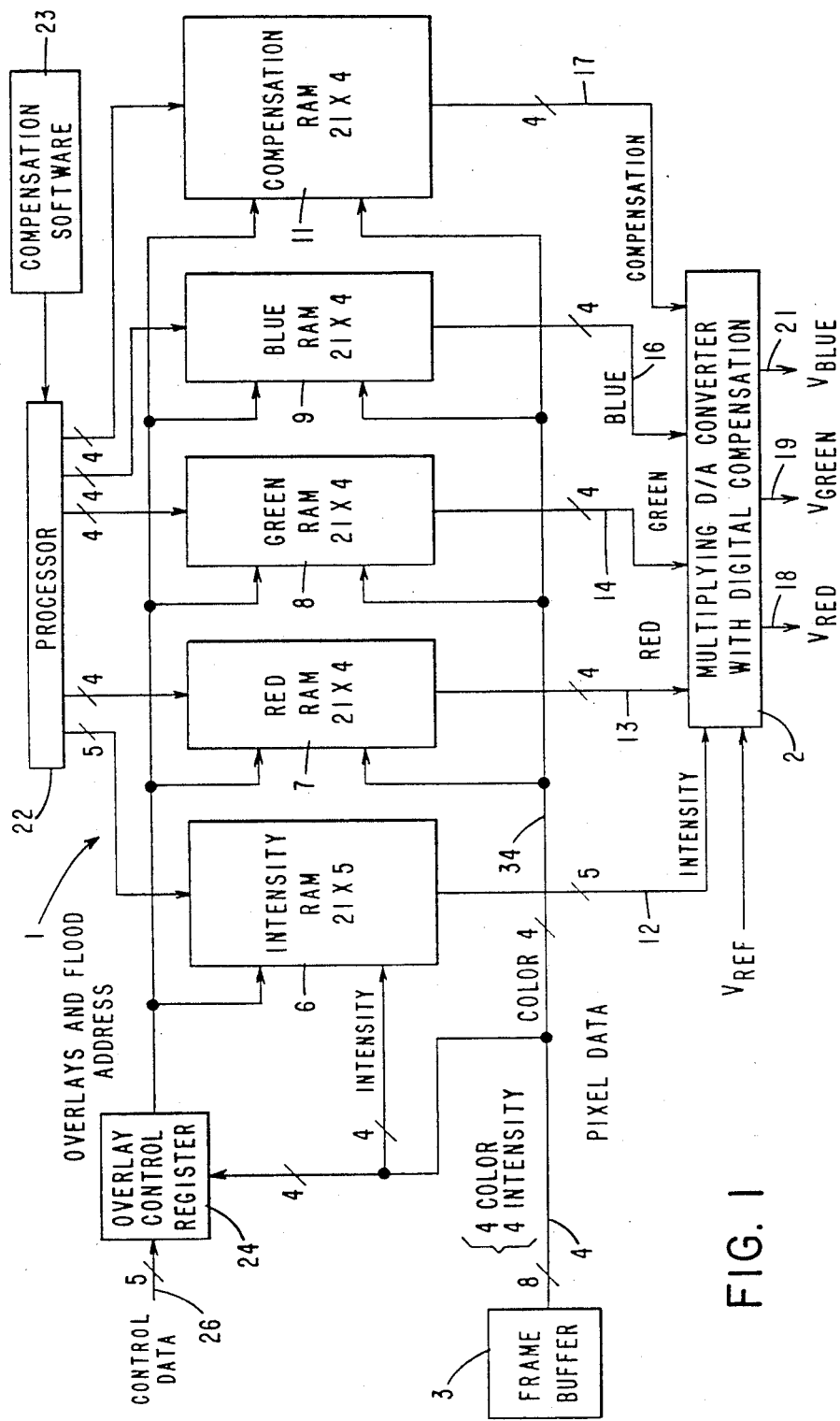
FIG. 1 is a schematic block diagram depicting the use of the invention within a video frequency color graphics control circuit.

Attention is now directed to FIG. 1 of the drawings, where one embodiment of the invention is set forth in the context of the functional architecture for an integrated circuit type color graphics control device, with the color generation circuitry generally designated at 1. Though the focus of attention will be on the multiplying D/A converter with digital compensation, functional block 2, the composite color generation circuitry depicted in FIG. 1 provides a useful background for more fully appreciating the various beneficial aspects of the present invention.

In general, the function of the color generation circuitry 1 is to receive pixel data from frame buffer 3, digitally representing both the color (hue and saturation) and intensity of the color corresponding to a time coincident pixel position in a raster scan type video display, and to convert that data into analog signals suitable, upon amplification, to drive the red, green and blue guns of a color video display. The color generation circuitry 1 must operate at video frequencies up to 30 MHz and form but one area segment of an integrated circuit chip which performs all the operations associated with a color graphics controller. In particular, the color graphics circuitry is to provide fade capability responsive to the intensity data while maintaining a fixed balance of the color consistent with the selected color (hue and saturation) data.

For the particular embodiment depicted in FIG. 1, the eight bit digital format pixel data, representing the color and intensity, from frame buffer 3 on bus 4 serve as addresses for intensity RAM 6, color RAMs 7, 8 and 9, and compensation RAM 11 to select four bit digital words on corresponding buses 12, 13, 14, 16 and 17 as the digital data inputs to multiplying D/A converter with digital compensation 2. The outputs from multiplying D/A converter 2 are the analog format voltage signals for the red, green and blue intensities directed to the video display. The analog output signals $V_{RED}$, $V_{GREEN}$ and $V_{BLUE}$ appear on lines 18, 19 and 21.

Processor 22 responds to external commands in selecting the set of intensity and color combinations to be loaded into RAMs 6, 7, 8 and 9. Furthermore, in response to such commands and resident compensation software 23, processor 22 also generates a corresponding compensation word for RAM 11. In this way, the table of intensity, color and compensation data resident in RAMs 6, 7, 8, 9 and 11 can be changed during the vertical or horizontal blanking periods of the video display operation without altering the pixel data in frame buffer 3.

Overlay control register 24 provides additional flexibility in the color generation scheme by using four RAM row addresses for overlay mode color data and one additional row address for flood color data. In this way, 256 different color combinations can be directly addressed by pixel data, while retaining the additional capability of providing overlay or flood colors without changing the color set then resident in the RAMs. Overlay control register 24 converts 5 bit control words furnished on bus 26 into addresses on line 27, to differentiate between the standard group of colors and the overlay and flood alternative colors in accordance with the logic set forth in FIG. 2 of the drawings. It should be appreciated that enablement of the overlay and flood control features inherently reduces the remaining color combinations available. Since the use and functional implementation of overlay and flood control features are discretionary, and bear only secondarily on the present invention, the specific configuration thereof will be left to the individual designer.

Figure 3:
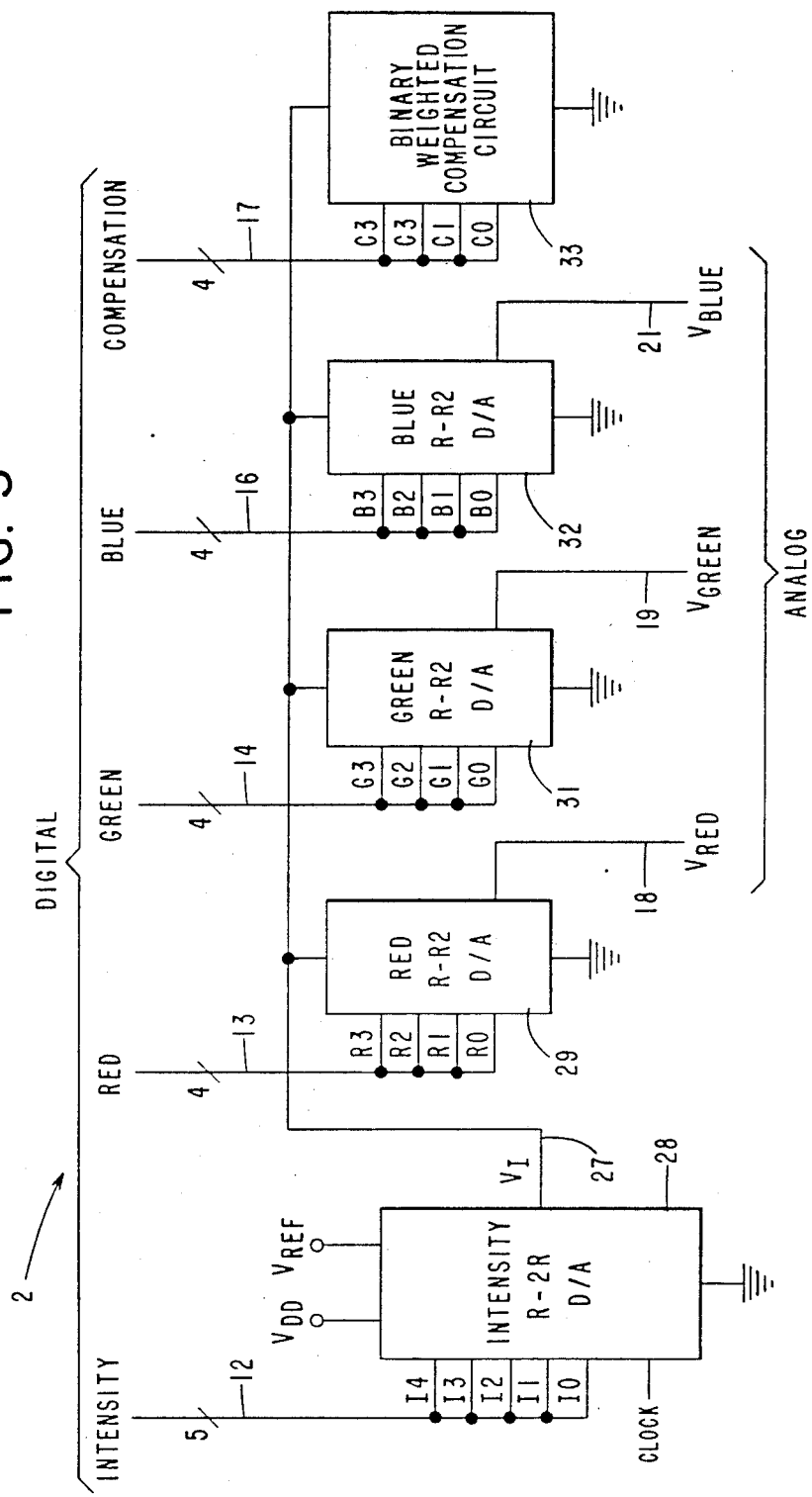
FIG. 3 is a preferred embodiment of the compensated, high frequency multiplying digital to analog converter in schematic block diagram form.

The features within multiplying D/A converter 2 in FIG. 1 are shown with greater detail in FIG. 3. As shown, the inputs consist of digital binary data words corresponding to the intensity, red, green, blue and compensation signals while the outputs are analog signal voltages $V_{RED}$, $V_{GREEN}$ and $V_{BLUE}$ on lines 18, 19 and 21, for controlling the corresponding video display drive signals. $V_{DD}$ is the power supply voltage, $V_{REF}$ is an externally generated reference voltage and CLOCK is a synchronization clock signal. As embodied, multiplying D/A converter 2 has a group of four R-2R ladder type D/A converters which are configured so that the analog output voltage $V_I$ on line 27 from intensity D/A converter 28 serves as the reference voltage for D/A converters 29, 31 and 32, for the red, green and blue colors, respectively. In addition, $V_I$ reference voltage line 27 is connected to the reference input of binary weighted, switched load type compensation circuit 33, which as shown has no output. Note that according to the arrangement set forth in FIG. 3, the outputs of multiplying D/A converter 2 are related to inputs in accordance with the desired relationship; namely:

$$K = W_I \times W_K (K = R, G, B).$$

K is the magnitude of the output signal, for each color red, green and blue (R, G and B), $W_I$ is the weight of the intensity word and $W_K$ is the weight of the color word.

Figure 4:
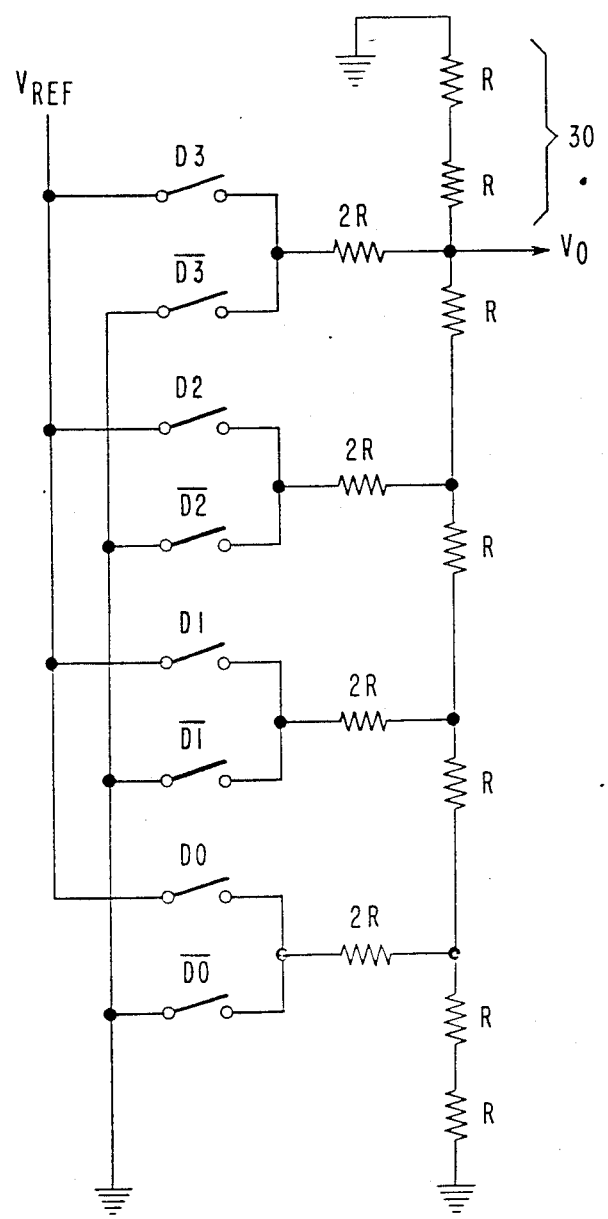
FIG. 4 is a schematic of a classic R-2R ladder used in digital to analog conversion.

An appreciation for the purpose of compensation circuit 33 can be gained by referring to the generalized schematic for an R-2R ladder configured to convert four bit digital words into equivalent analog output voltages. As depicted in FIG. 4, the status of switches D0-D3 are related to the binary state of the corresponding bits in the word to be converted, and such prescribes which 2R resistors are grounded and which 2R resistors are connected to the reference voltage $V_{REF}$ for the ladder. For example, if the status of switches D0-D3 represent a data word having the binary combination 0001, then switches $\overline{D0}$, $\overline{D1}$, $\overline{D2}$ and D3 would be closed and the output at $V_O$ would be determined by the resistive voltage divider formed thereby. However, the actual voltage at $V_O$ is affected by the load impedance of any circuit connected to that node. Clearly then, it can be appreciated that the functionally multiplying interconnection between intensity D/A ladder 28 and color D/A ladders 29, 31 and 32 in FIG. 3 present different load impedance states on line 27 as the bit content of the digital, red, green and blue words vary. Because the red, green and blue D/A converter ladders are all cascaded from the intensity D/A converter ladder, and VREF is considered a stable voltage source, it is the load variations on line 27 that create the problems.

The output impedance of a ladder such as depicted in FIG. 4 is constant and can by inspection be expressed as $$R_o = \frac{2}{3} R.$$

However, as was described hereinbefore the input impedance with respect to $V_{REF}$ is not a constant, but depends on the input data bits which actuate switches D0-D3. For an R-2R ladder of the form depicted in FIG. 4 there are six different input impedances due to the symmetry of the input data words. The data word values, in decimal, and corresponding input impedances are set forth in Table A.

TABLE A

| Data Word Value | Input Impedance |
|---|---|
| 0 | Infinity |
| 1,2,4,8 | 3 R |
| 3,6,12 | 2 R |
| 5,7,10,14 | 12/7 R |
| 9,15 | 8/5 R |
| 11,13 | 24/17 R |

With the exception of the case where the data word is zero, the input impedance varies over a range of approximately 2:1.

Reflecting back to FIG. 3, this means that the effective impedance on line 27 can vary over a range of approximately 2:1 and thereby load intensity D/A converter 28 sufficiently to change the reference voltage $V_I$, which voltage serves as a reference for the red, green and blue D/As. According to one aspect of the present invention, intensity D/A ladder 28 is internally compensated for the loading effects on line 27 while the loads themselves are compensated so as to be substantially fixed in magnitude, irrespective of the data represented by color words provided to D/A converter ladders 29, 31 and 32. The presently preferred implementation for maintaining a substantially fixed load on line 27 involves the addition of binary weight compensation circuit 33, which circuit switches it effective loading on line 27 in response to digital compensation words furnished on bus 17. Compensation circuit 33 is configured to maintain a substantially constant level of load impedance on line 27 by resistively offsetting load variations in the red, green and blue D/As. Thereby, compensation words are associated by direct correspondence to different sets of color words.

According to an alternate embodiment the compensation function is integrated into the three color D/A converter ladders, such as 29, 31 and 32 in FIG. 3, by increasing the bit length of the color words to incorporate compensation signals and by correspondingly increasing the switched elements within each such ladder. Again, the objective is to maintain a fixed impedance load on line 27, preferably at a minimum level.

Referring back to FIG. 1, recall that a four bit compensation word is generated by processor 22 in accordance with compensation software 23 and loaded into compensation RAM 11 at the time each combination of red, green and blue color words are loaded into corresponding row positions in color RAMs 7, 8 and 9. Consequently, the addressing of a row by color address bus 34 selects in conjunction with the red, green and blue data words a four bit compensation word suitable to offset the load change on line 27 (FIG. 3).

Though, according to an alternate embodiment of the present invention, it is possible to store the compensation words corresponding to each combination of red, green and blue data words in a ROM and address that ROM each time a pixel data word is converted from digital to analog form, this implementation would unfortunately require a relatively large ROM to compensate for all 4096 possible color word combinations. Therefore, the preferred arrangement for obtaining compensation words uses, as shown in FIG. 1, a software code suitable to generate a compensation word for each set of color words depending on the bit content of the three color words. Recall that the purpose of the algorithm is to generate compensation words which actuate binary weighted compensation circuit 33 to maintain a composite impedance level on line 27 which is nearly constant and substantially equal to the termination leg of the intensity ladder which the group is intended to replace. In the context of FIGS. 3 and 4, where the R-2R ladder in FIG. 4 corresponds to intensity D/A converter 28, compensation circuit 33 is intended to ensure that the load impedance at the node corresponding to $V_O$ in the ladder of FIG. 4 is the same as the impedance on the node corresponding to line 27 in FIG. 3. The algorithm is as follows:

1. Examine each color word (R, G or B) and check for the following conditions:

| Condition | Compensation Word Weight |
|---|---|
| (a) all zeros | 1000 LSB |
| (b) a single one only | 0100 |
| (c) two adjacent ones only | 0010 |
| (d) only one zero, but not on either end | 0000 |
| (e) remaining words | 0001 |

2. Add weights for R, G and B.
3. Add 1.
4. Multiply by ¾ (add three times/shift twice).
5. If result is greater than 15, then set result to the default value.
6. Append result to the corresponding three color words as the compensation word.
7. End.

Steps 2–4 of the algorithm are empirical with the intent of averaging the effects of the three color stages and normalizing their result to four bits. In this respect, step 3 compensates for the round-off of the simple ¾ multiply of step 4. Step 5 takes into account the situation where all color outputs are zero, and as such can be set to any value. This algorithm provides for compensation having a maximum error of one least significant bit, and therefore provides correction to within approximately 5% of the color word combination.

Unfortunately, the integration of multiplying D/A converter 2 into a circuit suitable for formation within an integrated circuit chip requires further refinement to perform at the 30 MHz bandwidth of a raster scan type color video display. Given the required operating frequency and a nominal 15 pf load capacitance for FETs performing switching functions within a D/A ladder of the type depicted in FIG. 4, it can be readily ascertained from signal rise and fall time requirements that the output impedance from a ladder should be in the range of 200 ohms. On the basis of the known relationships between the output impedance of a ladder and the values of the resistors within the ladder, wherein the output impedance $R_0$ equals $2R/3$, one can estimate the size of the resistors within color D/A converter ladders 29, 31 and 32 to be in the range of 300 ohms. To ensure that switches such as D0–D3 (FIG. 4) have an operating resistance sufficiently small to maintain an accuracy of at least ½ the least significant bit in a four bit word, the switch resistance must be approximately 1/15 of the 2R value, approximately 40 ohms. Applying this switch requirement to an equation characterizing an n-channel field effect transistor in which the gate voltage is at the supply voltage level, one develops the following required relationship between the width and length of the field effect transistor.

$$W/L = 1/uC_{OX}(V_{DD} - V_T)R_{ON}$$
$$= 1/(30E-6)(4.5-.8)40$$
$$= 225$$

This relationship of width to length requires an effective channel width of approximately 562 microns for an effective channel length of 2.5 microns. From the required operating frequencies, this transistor would have to be switched in approximately 7.5 nanoseconds. Though the transistor and switching times defined above are reasonable for the color D/A converters, intensity D/A converter 28, from which the color converters and compensation circuit cascade, requires a significantly lower output impedance, nominally ⅓ the impedance of the color D/A converters. To use field effect transistors as switches in that context would require that the transistors have a width of approximately 1,500 micrometers, a dimension which cannot be reasonably attained with conventional integrated circuits when the required switching time is approximately 7.5 nanoseconds.

To overcome this constraint on the size of the switching field effect transistors in intensity D/A converter 28, it is preferred that the transistors be operated in the linear region, and by way of appropriate dimensioning integrate both the switching and resistor functions therein. This embodiment is set forth schematically in the composite of FIGS. 5A and 5B, where the intensity, color and compensation circuits are shown in a form suitable for fabrication on an integrated circuit chip. The integration of the switching and resistive functions in a common set of dimensionally related field effect transistors also benefits from the tracking of performance parameters when such transistors are in close proximity and are subjected to the same fabrication process conditions.

Figure 5A:
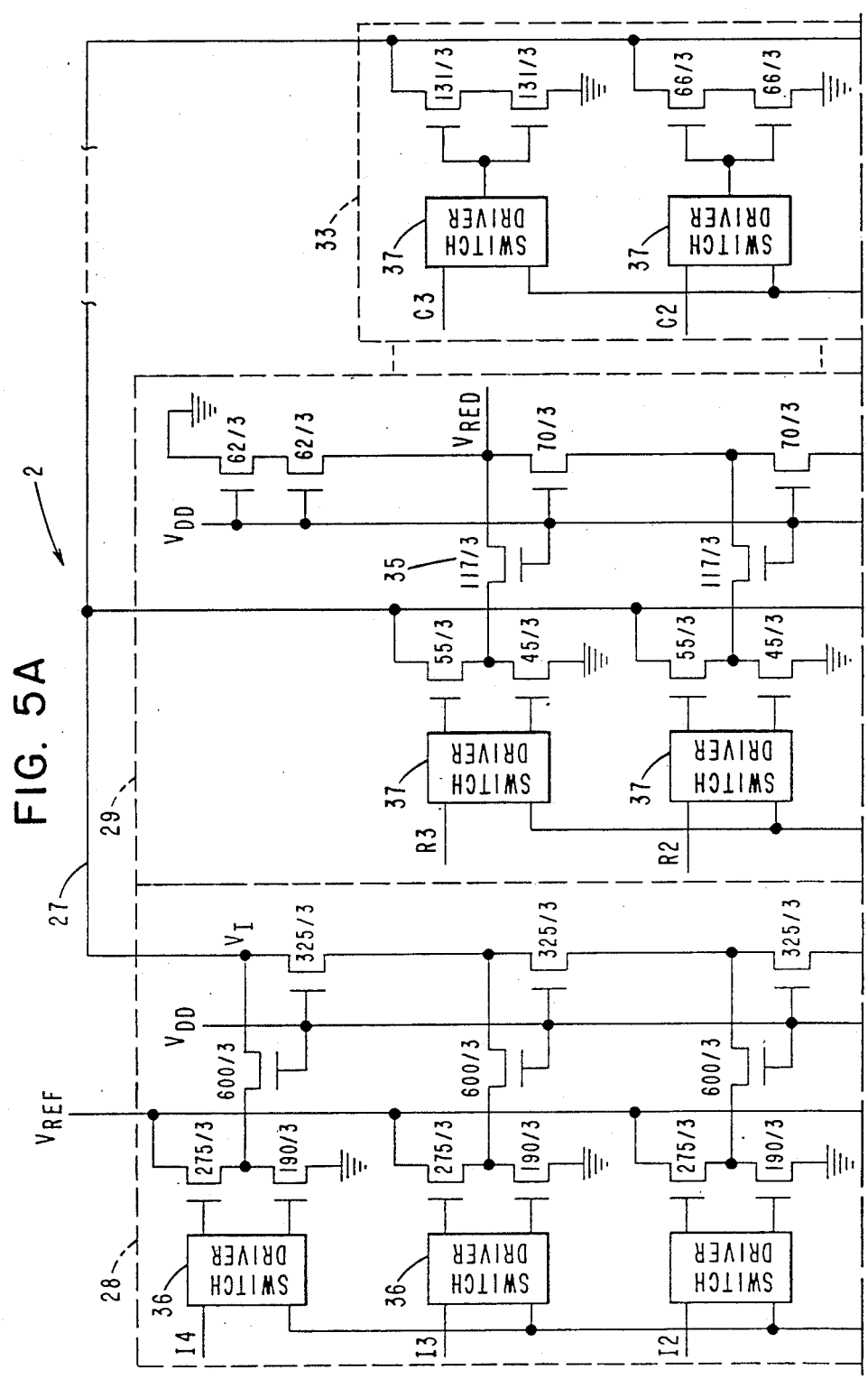
FIGS. 5A and 5B in the composite represent a schematic implementing the block diagrams in FIG. 4 using integrated field effect transistors.
Figure 5B:
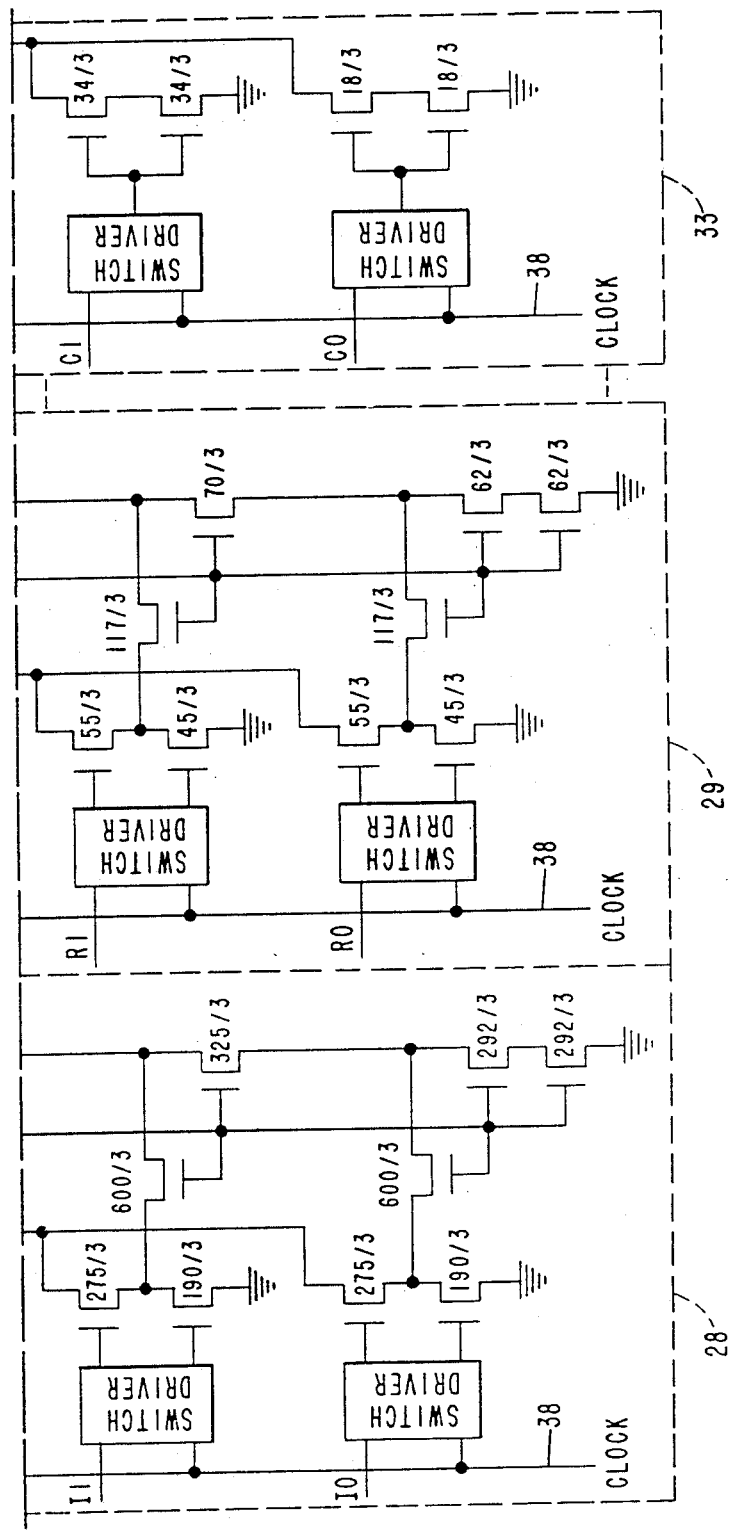

The embodiment set forth in FIGS. 5A and 5B clearly shows the width-to-length ratios for each field effect transistor in the intensity, color and compensation D/A converter ladders. In FIGS. 5A and 5B, intensity D/A converter 28 appears generally at the left, red color D/A converter 29 is shown immediately adjacent, and compensation circuit 33 is shown at the right. The green and blue D/A converters, being substantially identical to red color D/A converter 29 would be situated between converters 29 and 33 according to the representation set forth in FIG. 3. Preferably, the reference voltage $V_{REF}$ is in the range of 2 volts and the power supply voltage $V_{DD}$ is in the range of 4.5 volts.

Though most aspects of the elements within the field effect transistor ladders shown in FIGS. 5A and 5B can be readily related by correspondence to elements of the D/A converters depicted in FIG. 3, as supplemented by the representation in FIG. 4, particular attention is directed to line 27. The resistance to ground, corresponding to resistors 30 from node $V_O$ in FIG. 4, are actually the equivalent load resistance of the red, green, blue, and compensation circuits connected to line 27.

The transistor dimensions set forth in FIGS. 5A and 5B include some trial and error size choices. However, the size choices are determined, in order of importance, by impedance considerations for high frequency operation, compensation for source voltage effects on resistance, and a weighting scheme to widen fixed bias devices and make more narrow switched devices without significantly impacting the total area. The first consideration determines the widths of the stacked fixed bias devices which terminate the ladders, resulting in a 62 micrometer channel widths. The second consideration results in having the switches connected to $V_I$ be 55 micrometers in width, wider than the transistor switches having their sources electrodes connected to ground. The third consideration redistributes the widths so that the transistors, such as 35 in FIG. 5A, situated between switches providing either $V_I$ or ground, made 117 micrometers in width, become the widest, while the switch transistor widths themselves are reduced to 55 and 45 micrometers. These dimensions make it easier for the intensity ladder to drive the color ladders and compensation circuit. The choice of 70 micrometer width transistors for interconnecting the successive bits of the color ladder was discretionary.

Simulations have shown that the compensated multiplying D/A converter depicted in the composite of FIGS. 5A and 5B is able to maintain an accuracy of ±½ the least significant bit for four bit words operated with $V_{REF}$ at 2 volts and $V_{DD}$ at 4.5 volts.

One important feature of the embodiment depicted in the composite of FIGS. 5A and 5B lies in matching of the response times, where the intensity D/A converter 28 switches in approximately the same switch time that the driven color D/A converters and compensation circuit change. Such time coincidence ensures that the analog outputs are valid at substantially all times for both intensity and color. This feature avoids the requirement for latching data words, which might otherwise be required if the dynamics of the intensity and color D/A converter ladders were not substantially matched.

Figure 6:
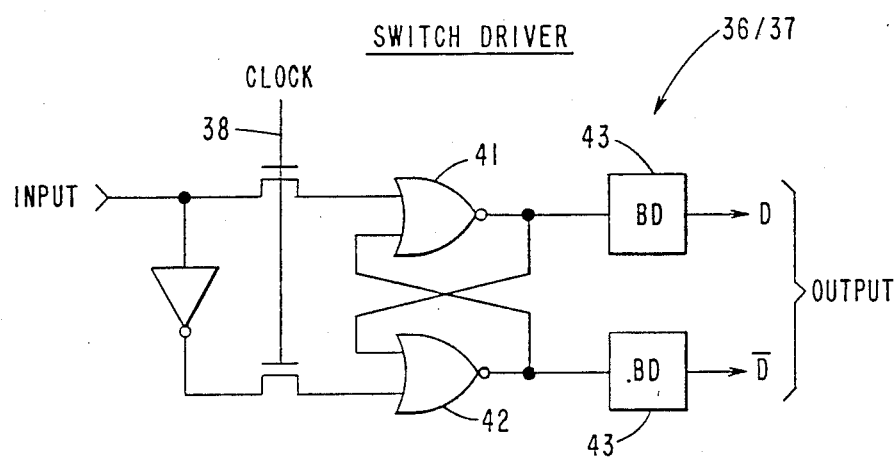
FIG. 6 is a schematic representation of the switch driver functions depicted in FIGS. 5A and 5B.

The multiplying D/A converter with digital compensation as embodied in FIGS. 5A and 5B has shown to exhibit a very short settling time, attributable to low internal capacitances and relatively low impedances when driven by drivers which are themselves capable of high frequency operation. As depicted in FIGS. 5A and 5B, the digital intensity, color and compensation words, $I_0-I_4$, $R_0-R_3$, $G_0-G_3$, $B_0-B_3$ and $C_0-C_3$, drive the corresponding circuits through switch drivers 36 and 37. As shown in FIGS. 5B and 6, the intensity, color and compensation word inputs to switch driver 36 and 37 are synchronized by a clock signal on line 38 to drive cross-coupled NOR gates 41 and 42, and thereafter inverting bootstrapped drivers 43. Booting drivers 43 provide low impedance drive signals, and therefore short settling times, for the switch drive signals on lines D and $\overline{D}$. The nonoverlapping signals from NOR gates 41 and 42 become overlapping for approximately 4 nanoseconds upon passing through booting drivers 43, which slight overlap is preferred as a means for increasing the switching speed of the field effect transistors connected to output lines D and $\overline{D}$. Switch drivers 36, for the intensity ladder, and switch drivers 37, for the color ladders and compensation circuit, differ slightly to take into account the dimensional differences in the driver transistors, and are of such a character that their design would be readily perceived by anyone of reasonable skill in the art.

Figure 7:
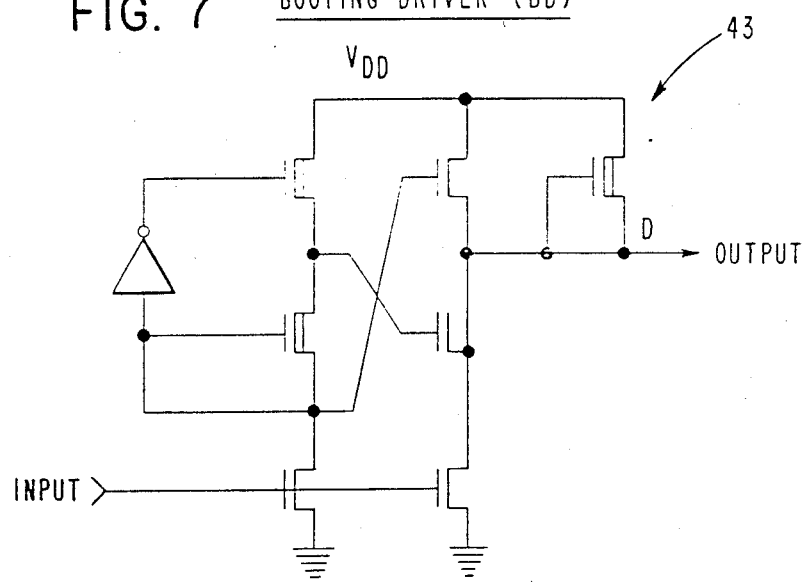
FIG. 7 is a schematic of the booting driver function depicted schematically in FIG. 6.

The booting driver circuit is schematically depicted in FIG. 7. It should be noted that because the booting driver circuit drives a variety of different switch gates, depending on whether it is in the intensity, color or compensation circuit, the booting driver transistors may require some adjustment to provide a match of the signal delay times while maintaining good booting action. As embodied, the intensity D/A converter characteristics were used as the design standard, adjusting the other D/A converter ladder booting drivers to match the performance of the intensity D/A ladder.

The invention has been described and shown with reference to a specific set of embodiments which do not necessarily constitute all the ways the invention may be practiced. Accordingly, it should be understood and appreciated that the claimed subject matter should cover the full scope and spirit of the underlying invention.

We claim:

1. A multiplying digital to analog converter comprising:

a first digital to analog converter providing an analog output in response to a first digital word input;

a second digital to analog converter connected to receive the output from the first digital to analog converter and provide an output responsive to a second digital input word and in proportion to the magnitude of the output of the first digital to analog converter; and compensation means, connected to the second digital to analog converter and varying in magnitude based upon the data represented by the second digital input word, for offsetting loading effects on the first digital to analog converter caused by changes in the second digital word.

2. The subject matter recited in claim 1, wherein the digital to analog converters are conductively operative ladder networks.

3. The subject matter recited in claim 2, wherein the conductively operative ladder is of an R-2R configuration.

4. The subject matter recited in claim 3, wherein the compensation is binary weighted switched load external to the second digital to analog converter ladder.

5. The subject matter recited in claim 4, wherein the binary weighted switched load receives third digital words which vary the impedance of the binary weighted switched load to offset changes in the ladder of the second digital to analog converter so as to maintain a substantially constant load on the output of the first digital to analog converter.

6. The subject matter recited in claim 3, further comprising:

a third digital to analog converter ladder connected to receive as a reference the output from the first digital to analog converter ladder and provide an output responsive to a fourth digital word and in proportion to the magnitude of the output of the first digital to analog converter; and a fourth digital to analog converter ladder connected to receive the output from the first digital to analog converter ladder and provide an output responsive to a fifth digital word and in proportion to the magnitude of the output.

7. The subject matter recited in claim 6, wherein the compensation means is responsive to the combined loading effect of changes in the digital words input into the second, third and fourth digital to analog converter ladders and is in the form of a binary weighted switched load connected to the output of the first digital to analog converter ladder so as to maintain a substantially constant load on the output of the first digital to analog converter ladder.

8. A multiplying digital to analog converter comprising:

a first conductively operated R-2R ladder providing an analog output in response to a first digital word input;

a second conductively operated R-2R ladder connected to receive the output from the first conductively operated R-2R ladder and provide an output responsive to a second digital input word and in proportion to the magnitude of the output of the first conductively operated R-2R ladder; and compensation means, formed as one part of the second conductively operated R-2R ladder and varying in magnitude based upon the data represented by the second digital input word, for offsetting loading effects on the first conductively operated R-2R ladder caused by changes in the second digital word.

9. A multiplying digital to analog converter comprising:

a first conductively operated R-2R ladder providing an analog output in response to a first digital word input;

a second conductively operated R-2R ladder connected to receive the output from the first conductively operated R-2R ladder and provide an output responsive to a second digital input word and in proportion to the magnitude of the output of the first conductively operated R-2R ladder;

a third conductively operated R-2R ladder connected to receive the output from the first conductively operated R-2R ladder and provide an output responsive to a third digital word and in proportion to the magnitude of the output of the first conductively operated R-2R ladder;

a fourth conductively operated R-2R ladder connected to receive the output from the first conductively operated R-2R ladder and provide an output responsive to a fourth digital word and in proportion to the magnitude of the output of the first conductively operated R-2R ladder; and compensation means, formed into the second, third and fourth conductively operated R-2R ladders and varying in magnitude based upon the data represented by the respective second, third and fourth conductively operated R-2R ladders to maintain a substantially constant load on the output of the first conductively operated R-2R ladder.

* * * * *